United States Patent [19]
Katoh et al.

[11] Patent Number: 4,801,208
[45] Date of Patent: Jan. 31, 1989

[54] PROJECTION TYPE EXPOSING APPARATUS

[75] Inventors: Kinya Katoh; Toshio Matsuura, both of Tokyo, Japan

[73] Assignee: Nikon Corporation, Tokyo, Japan

[21] Appl. No.: 901,587

[22] Filed: Aug. 29, 1986

Related U.S. Application Data

[63] Continuation-in-part of Ser. No. 796,785, Nov. 12, 1985, Pat. No. 4,710,029.

[30] Foreign Application Priority Data

Nov. 19, 1984 [JP] Japan .................................. 59-244229
Sep. 2, 1985 [JP] Japan .................................. 60-193589

[51] Int. Cl.$^4$ ............................................. G01B 11/27
[52] U.S. Cl. ...................................... 356/401; 250/548
[58] Field of Search ..................... 356/400, 401, 150; 250/491.1, 548

[56] References Cited

U.S. PATENT DOCUMENTS

| 4,251,129 | 2/1981 | Suzki et al. ......................... 356/401 |
| 4,362,389 | 12/1982 | Koizumi et al. ..................... 356/401 |
| 4,655,599 | 4/1987 | Ayata et al. ......................... 356/401 |

FOREIGN PATENT DOCUMENTS

60-10540 6/1985 Japan .

*Primary Examiner*—Richard A. Rosenberger
*Attorney, Agent, or Firm*—Shapiro and Shapiro

[57] ABSTRACT

Alignment of a mask with a projection-type exposing apparatus and alignment of the mask with a substrate are provided. Plural exposure areas of the substrate are exposed by light of a predetermined wavelength, which is also used for alignment purposes to reduce alignment error due to aberration of a projection optical system. A first alignment mark is disposed in a first area between adjacent exposure areas of the substrate. The mask has a main area, a second area in which a second mark is disposed, and a third area in which a third mark is disposed, the second area being outside of the main area and the third area being inside the second area. An illuminating device has a first status in which the second and third areas are illuminated simultaneously and has a second status in which the third area is illuminated, a first area adjacent to one of the exposure areas also being illuminated when the illuminating device has the second status. In the first status, a first detector detects the position of an image of the second mark formed by an objective optical system. In the second status, a second detector detects displacement between images of the first and third marks formed by the objective optical system and produces a detection signal. The mask is displaced relative to the substrate in response to the detection signal, so that the images of the first and third marks assume a predetermined relationship.

17 Claims, 11 Drawing Sheets

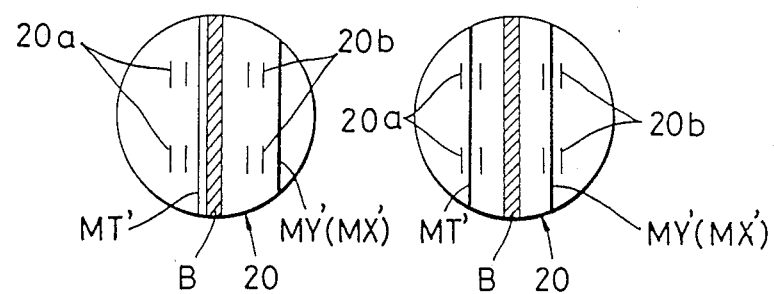
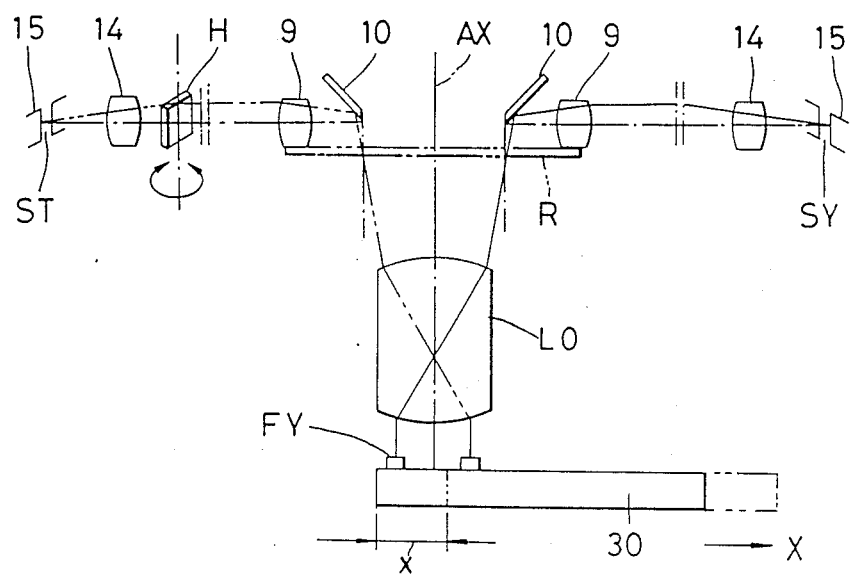

PROJECTION TYPE EXPOSING APPARATUS

CROSS-REFERENCE TO RELATED APPLICATION

This application is a continuation-in-part of U.S. application Ser. No. 796,785, now U.S. Pat. No. 4,710,029 issued Dec. 1, 1987, filed Nov. 12, 1985. (incorporated herein by reference).

BACKGROUND OF THE INVENTION

1. Field of the Invention

This invention relates to an exposing apparatus used for the manufacture of semiconductor elements, and in particular to a reticle alignment optical system in a projection type exposing apparatus.

2. Description of the Prior Art

Heretofore, generally in a reduction projection type exposing apparatus, the images of a plurality of alignment marks provided on a reticle have been formed on a slit in an alignment optical system, and alignment of the reticle has been accomplished by the photoelectric signals from photoelectric detectors disposed rearwardly of the slit, with the slit as the reference. Such alignment is effected on the premise that the slit in the alignment optical system is kept in a strictly predetermined positional relation to the movement of a stage for supporting thereon a wafer as an exposed object on which the pattern on the reticle is printed by means of a projection objective. For this reason, it is necessary that by the use of a reference mark (fiducial mark) provided on the stage on which the wafer is placed, one slit in the alignment optical system and the fiducial mark is optically brought into coincidence with each other through the projection objective, whereafter the stage is moved, whereby the alingment optical system be adjusted so that the fiducial mark and another slit in the alignment optical system are coincident with each other through the projection objective.

In this case, the interval between the plurality of alignment marks on the reticle is determined to a predetermined value and therefore, in order to bring the fiducial mark into coincidence with the slit corresponding to one alignment mark and thereafter bring the fiducial mark into coincidence with the slit corresponding to the other alignment mark, the stage is moved by a value corresponding to the product of the value of the interval between the alignment marks and the projection magnification. Where the other alignment mark and the fiducial mark are not coincident with each other, the alignment optical system is adjusted by Harbing glass (a parallel flat plate rotatable to vary the inclination thereof relative to the optical axis) so that the two are coincident with each other. It is very important in alignment of the reticle to accurately align the slits in the alignment optical system relative to the running of the stage in this manner.

However, when the optical position adjustment of each slit in the alignment optical system is to be effected by the fiducial mark through the projection objective, if the magnification of the projection objective is varied from a standard magnification by some cause or other, it is difficult to accomplish accurate alignment even if the stage is moved by the value of the product of the predetermined value of the interval between the alignment marks and the projection magnification, and this has led to the possibility of an error. Where, as shown in the plan view of FIG. 8 of the accompanying drawings (which shows the positional relation on the surface of the reticle R), the alignment marks on the reticle comprise a (+) mark and a (−) mark along an edge of the reticle, namely, at a position along a line orthogonal to the optical axis Ax of the projection objective, if the projection magnification of the objective is varied from $\beta$ to $\beta'$ by some cause or other, the position of the fiducial mark on the reticle moves from F$\gamma$ indicated by solid line to F$\gamma'$ indicated by dotted line. Since the distance between the alignment marks formed on the reticle is determined to a predetermined value, the stage is moved by amounts x and y corresponding to the multiples of this value, but if the magnification of the projection objective is varied to $\beta'$, the position of the fiducial mark on the reticle is displaced not only in X direction but also in Y direction. If the reticle is to be aligned by the alignment optical system adjusted in such a state, the position of the reticle cannot be accurately aligned relative to the apparatus body and particularly, a rotational error of the reticle will occur. Thus, an error will occur during the superposition printing of a plurality of patterns on the wafer and it will become impossible to manufacture semiconductor elements having minute patterns high in degree of integration.

SUMMARY OF THE INVENTION

It is an object of the present invention to provide a projection type exposing apparatus in which alignment of a reticle can be accurately accomplished even when the projection magnification of a projection objective fluctuates.

It is another object of the invention to provide a projection type exposing apparatus which has a alignment optical system for aligning a reticle with the exposing apparatus and for aligning the reticle with a wafer.

It is a further object to provide a reticle which has a first mark for using an alignment between the reticle and the exposing apparatus and a second mark for using an alignment between the reticle and the wafer.

According to the present invention, in a projection type exposing apparatus having a projection objective for projecting a pattern on a reticle onto a wafer, alignment optical systems each having an imaging optical system for forming the images of a plurality of alignment marks provided on the reticle and a photoelectric detecting slit disposed at the image plane position of said imaging optical system to detect the positions of said plurality of alignment marks, and a reference index mark formed on a stage supporting a wafer thereon to set the reference position of the slits in said alignment optical systems, the photoelectric detecting slit disposed at the image plane position of the imaging optical system in each of said alignment optical systems is constructed such that the lengthwise direction thereof is coincident with a straight line passing through the optic axis of the projection objective on the reticle, and Harbing glass for causing the relative position of the photoelectric detecting slits provided in the plurality of alignment optical systems to be optically varied by a minute amount in a direction perpendicular to the lengthwise direction of said slits is disposed in one of the alignment optical systems.

In such a construction, it is a premise that the plurality of alignment marks provided on the reticle have directions intersecting each other on the optic axis of the objective. By adjusting the angle of inclination of the Harbing glass provided in one of the alignment optical systems, the slits in the alignment optical systems are strictly aligned relative to the running of the stage on the basis of the fiducial mark as the reference index mark provided on the stage, and the initial setting for aligning the reticle relative to the apparatus body is done.

Desirably, in order to precisely align the reticle on a predetermined plane, three alignment marks are provided so as to be orthogonal to one another for the correction of X and Y direction positions and the angle of rotation and therefore, it is desirable to provide three alignment optical systems each comprising an imaging system and a photoelectric detecting system correspondingly to the respective alignment marks. To enable two of the three alignment marks to be observed in the same view field, it is desirable to provide a view field combining prism for forming the images by two alignment optical systems juxtaposedly on the same plane, and to cause the optical paths of one alignment optical system whose view field is combined and the remaining one alignment optical system to intersect each other and provide an optical path changing-over mirror at the position of intersection.

BRIEF DESCRIPTION OF THE DRAWINGS

FIGS. 3A and 3B show the observation view fields of the reticle alignment marks by the observation systems of the alignment optical systems.

FIG. 4 is an optical path diagram showing the positional relation between a fiducial mark on a stage and the reticle alignment optical systems.

DESCRIPTION OF THE PREFERRED EMBODIMENT

The present invention will hereinafter be described with respect to an embodiment thereof.

Figure 1:
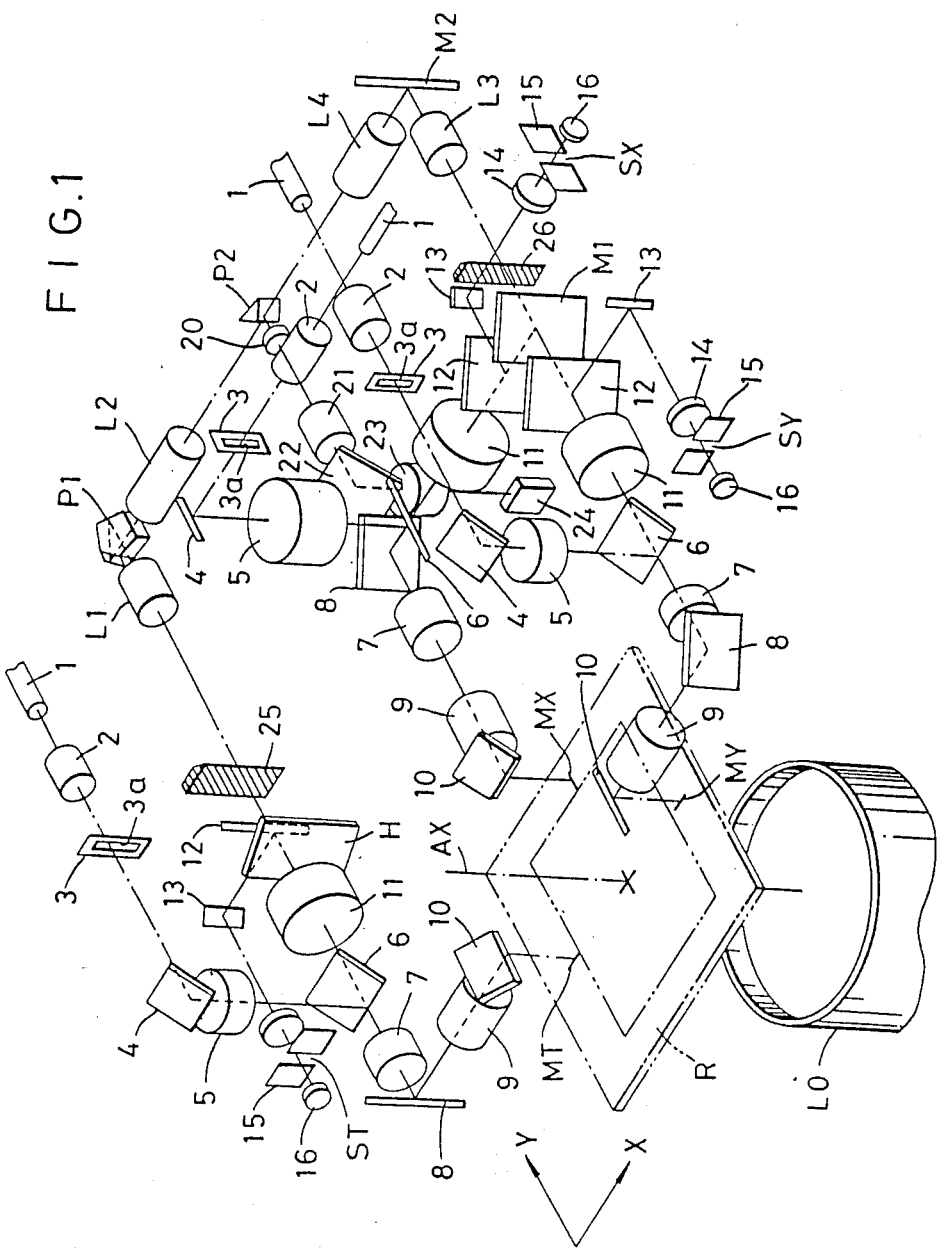
FIG. 1 is a schematic perspective view showing the construction of the reticle alignment optical systems according to the present invention.

FIG. 1 is a schematic perspective view showing a reticle alignment optical system in an embodiment wherein the present invention is applied to a reduction projection type exposing apparatus. A reticle R is uniformly illuminated from above as viewed in FIG. 1 by an illuminating system, not shown, and a predetermined pattern on the reticle is projected and imaged upon a wafer, not shown, as an object to be exposed, by a projection objective Lo. Three alignment marks for aligning the reticle R relative to the apparatus body, i.e., an alignment mark $M_X$ for alignment in X direction, an alignment mark $M_Y$ for alignment in Y direction and an alignment mark $M_T$ for rotational alignment, are provided around the predetermined pattern area on the reticle R on lines that intersect the optic axis Ax of the projection objective Lo. The alignment mark $M_Y$ for alignment in Y direction and the alignment mark $M_T$ for rotational alignment lie on the same straight line passing through the optic axis, and the alignment mark $M_X$ for alignment in X direction is provided on a line orthogonal to said straight line. Alignment optical systems are provided corresponding to the respective alignment marks, and the respective alignment optical systems have slits corresponding to the respective alignment marks, and the images of the respective marks are formed on these slits and the positions of these images are detected, whereby the alignment of the reticle R relative to the apparatus body is accomplished.

In the three alignment optical systems, light rays of the same wavelength as the wafer exposure light by the projection objective are supplied as illuminating light by an optical fiber, and so-called coaxial epi-illumination is effected, and the illuminating system, the imaging system and the photoelectric detecting system by the slit are substantially identical to one another. So, the Y direction alignment optical system for the alignment mark $M_Y$ for alignment in Y direction will now be described as an example. The illuminating light from the optical fiber 1 is condensed on a field stop 3 by a condensing lens 2 and is reflected by a half-mirror or semi-transparent mirror 6 via an optical path bending mirror 4 and a relay lens 5. This reflected light is condensed on the reticle R by a reflecting mirror 10 via a relay lens 7, an optical path bending mirror 8 and an alignment objective 9. The image of the field stop 3 is formed on the reticle R by the relay lenses 5, 7 and the objective 9. The field stop 3 is provided with a slit-like opening 3a, and the lengthwise direction of this slit-like opening 3a is disposed so that the image of the opening is as coincident with a line perpendicularly intersecting the optic axis Ax of the objective Lo on the reticle R. The light ray from the alignment mark $M_Y$ on the reticle R is reflected by a reflecting mirror 10, travels back along the objective 9, the optical path bending mirror 8 and the relay lens 7 and is transmitted through the semitransparent mirror 6. This transmitted light passes through a relay lens 11, is reflected by a half-mirror 12 or semitransparent mirror and is reflected by a minute vibratory mirror 13, whereafter it is condensed on a slit plate 15 having a slit $S_Y$, and the image of the alignment mark $M_Y$ provided on the reticle R is formed on the slit plate 15. The lengthwise direction of the slit $S_Y$ is disposed so as to correspond to a line that intersects the optic axis of the objective on the reticle. By the slit $S_Y$ putting the image of the alignment mark $M_Y$. therein, the relative alignment of the slit $S_Y$ and the alignment mark $M_Y$ is accomplished. A field lens 14 is disposed immediately in front of the slit plate, and a light beam passed through the slit $S_Y$ enters a photoelectric detector 16 and the quantity of this incident light is photoelectrically converted. The output of this photoelectric detector is synchronously detected by the driving signal of the minute vibratory mirror 13 vibrated at a high speed to vibrate the light beam in the widthwise direction of the slit $S_Y$, whereby the position of the alignment mark relative to the slit is accurately detected. This is as disclosed as prior art in Japanese Patent Publication No. 25602/1980 (corresponding to U.S. Pat. No. 3,912,372 issued Oct. 14, 1975) owned by the assignee.

The illuminating systems, the imaging systems and the photoelectric detecting systems by the slits in the alignment optical systems for the other alignment marks $M_X$ and $M_T$ are substantially the same as what has been described and therefore need not be described, but the slits in the respective alignment optical systems are constructed so that the lengthwise directions thereof correspond to straight lines intersecting the optic axis of the objective on the surface of the reticle. Also, the slits are constructed so that on the surface of the reticle, the lengthwise directions of the slit $S_Y$ of the Y direction alignment optical system and the slit $S_T$ of the rotational alignment optical system correspond to the same straight line and the lengthwise direction of the line corresponding to slit $S_X$ of the X direction alignment optical system is orthogonal to said straight line. In the drawings, members having similar functions are given similar reference numerals. The positions of the alignment marks on the reticle R are detected by the signals of the photoelectric detecting systems of such alignment optical systems, and the reticle R is moved by a servo system, not shown, so that the alignment marks on the reticle are accurately coincident with the slits of the respective alignment optical systems, whereby the alignment of the reticle relative to the apparatus body is automatically accomplished.

Figure 2:
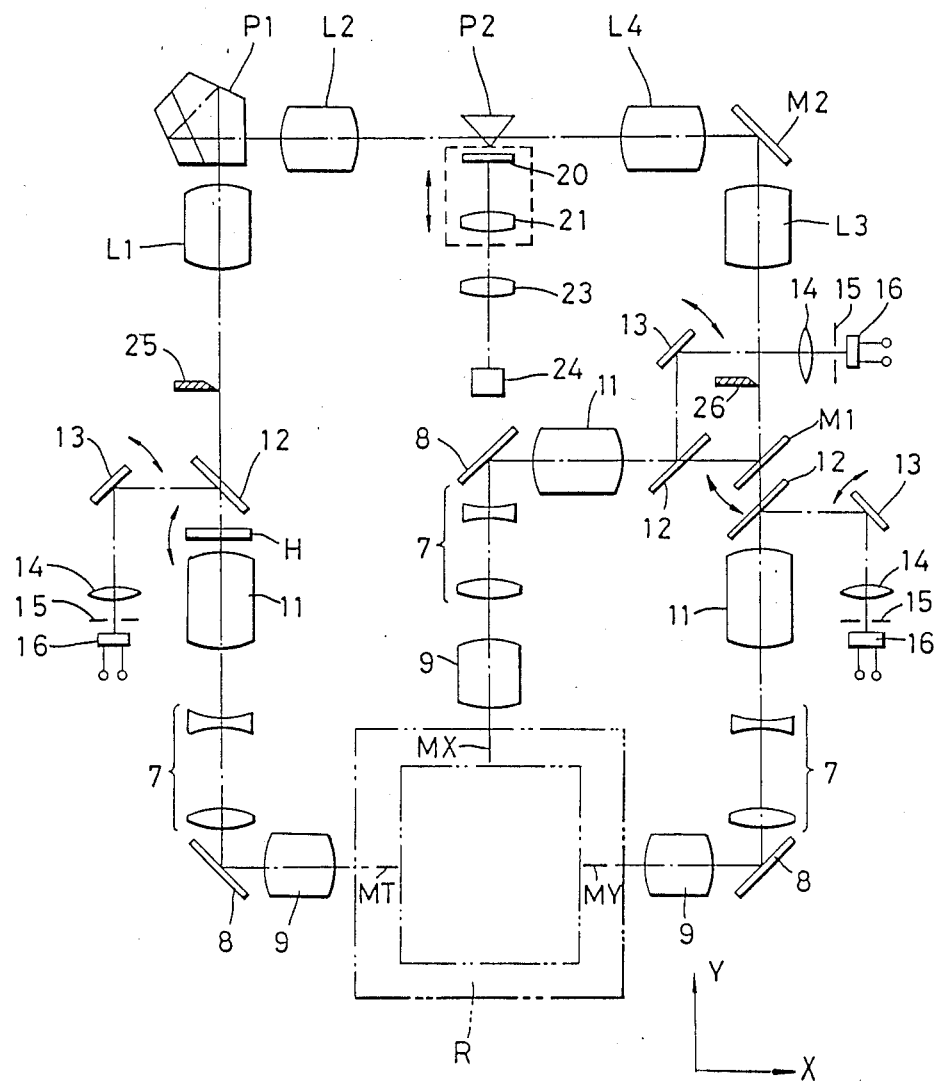
FIG. 2 is a schematic plan view of the reticle alignment optical systems of FIG. 1.

In addition to the photoelectric alignment systems for detecting the positions of such three alignment marks, there is provided an observation system for observing therethrough the positional relation between the images of the alignment marks. The construction of this observation system is shown in the schematic perspective view of FIG. 1, and is shown in greater detail in the schematic plan view of FIG. 2. In FIG. 2, in order to make the construction of the observation system easy to understand, the illuminating system of each alignment optical system and the semitransparent mirror 6 for coaxial illumination are omitted and the positions of the members are partly changed. The observation system is constructed so that the image of each alignment mark is formed by the use of the light transmitted through the semitransparent mirror 12 provided in each alignment optical system.

The alignment optical system for the alignment mark $M_T$ for detecting the rotational position of the reticle will first be considered. By the light transmitted through the semitransparent mirror 12, the primary image of the alignment mark is formed on a first light-intercepting plate 25 for intercepting the light beam on one side relative to the optic axis. The light beam from this primary image is subjected to the converging actions of a first relay lens L1 and a second relay lens L2 for observation and the reflecting action of a pentagonal roof prism P1 disposed therebetween and is reflected by one inclined surface of a rectangular prism P2 as a view field combining prism and condensed on a focusing screen 20, and the secondary image of the alignment mark $M_T$ is formed on the focusing screen. The observation systems for the X direction alignment mark $M_X$ and the Y direction alignment mark $M_Y$ use in common a pivotable mirror M1 pivotably provided to change over the optical path, and are selectively constructed so as to observe one of the alignment marks therethrough. The light beam transmitted through the semitransparent-mirror 12 in each alignment system is selectively directed to the observation optical path by the pivotable mirror M1, and the primary image of one of the alignment marks $M_X$ and $M_Y$ is formed on a second light-intercepting plate 26 for intercepting the light beam on one side relative to the optic axis. The light beam from this primary image is subjected to the actions of a third relay lens L3 and a fourth relay lens L4 for observation and a reflecting mirror M2 for bending the optical path provided therebetween and is reflected by the other inclined surface of the view field combining prism P2 and condensed on the focusing screen 20, and the secondary image of the X direction alignment mark $M_X$ or the Y direction alignment mark $M_Y$ is formed on the focusing screen.

The view field combining prism P2 is disposed so that the edge line thereof on which the two reflecting surfaces thereof intersect each other is coincident with the same optic axis of the second relay lens L2 for observation and the fourth relay lens L4 for observation or lies somewhat near the focusing screen 20 with respect to said optic axis. The first light-intercepting plate 25 and the second light-intercepting plate 26 intercept the light beam which is about to pass between the edge line of the view field combining prism P2 and the focusing screen 20 and therefore, the light beam from one optical path does not enter the other optical path to create a ghost. Also, the view field combining prism P2 is constructed so that the edge line thereof is coincident with the center of the focusing screen and the optic axis of the relay lenses 21 and 23 for causing the image on the focusing screen to be re-imaged on the image pickup surface of an image pickup device 24 such as a television camera. The pentagonal roof prism P1 disposed in the alignment optical system for detecting the rotational position has the function of controlling the direction in which the image of the alignment mark $M_T$ is displaced within the observation view field when the reticle R is moved in the direction in which the other alignment mark image formed in the same view field is displaced, by the dark surface thereof.

By the construction of the observation system using such view field combining prism P2, as shown in FIG. 3A, the image $M_T$, of the rotational direction alignment mark is formed on the focusing screen 20 on one side of the view field and the image $M_X$, of the X direction alignment mark or the image $M_Y'$ of the Y direction alignment mark is formed on the other side of the view field, and the positional relation between the two images can be observed by means of the image pickup device 24. After the automatic alignment by the aforementioned photoelectric detecting system, as shown in FIG. 3B, the images $M_T'$ and $M_X'$ or $M_Y'$ of the two alignment marks are aligned with embracing marks 20a and 20b for alignment provided on the focusing screen 20, whereby the state in which the alignment of the reticle has been achieved can be comfirmed. For the focusing of the two alignment mark images formed on the focusing screen 20, the focusing screen 20 and the relay lens 21 are moved together along the optic axis and thus, even in reticles of different thicknesses or refractive indices, it is possible to observe a sharp image. The black line B lying at the center of FIGS. 3A and 3B corresponds to the light-intercepting plates 25, 26 provided in the two observation systems whose view fields are combined with each other, and also corresponds to the edge line of the view field combining prism P2.

In the foregoing, a case has been described where the position of each alignment mark provided on the reticle R is detected by each alignment optical system, whereby the reticle is aligned relative to the alignment optical system, namely, the apparatus body. There will now be described the initial setting in which the adjustment relative to fiducial marks on a stage which provides the reference of alignment is effected in such an alignment optical system.

Figure 5:
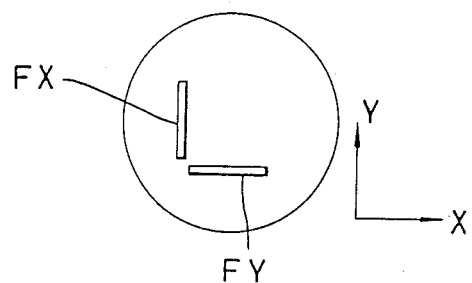
FIG. 5 is a plan view showing an example of the fiducial mark.

FIG. 4 is an optical path diagram showing the positional relation between the fiducial mark on a stage 30 and the reticle alignment optical system by the projection objective Lo. In FIG. 4, the intermediate member of the alignment optical system is omitted and members necessary for adjustment are chiefly shown. The fiducial mark provided on the stage 30, as shown in the plan view of FIG. 5, comprises a fiducial mark $F_X$ for X direction alignment provided in parallelism to Y direction and a fiducial mark $F_Y$ for Y direction alignment provided in a direction orthogonal thereto. The mark $F_Y$ for Y direction alignment is used for the adjustment of the alignment optical system relative to the running of the stage.

Figure 6A:
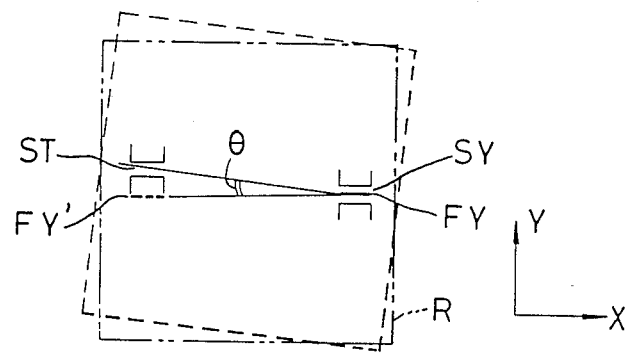
FIGS. 6A and 6B are plan views showing the positional relations on the surface of the reticle between the fiducial mark and each slit.
Figure 6B:
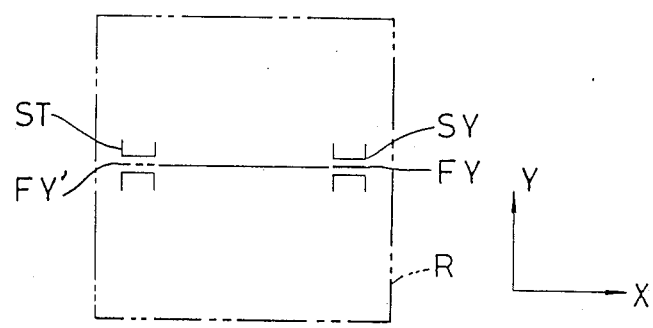

Let it be assumed that as indicated by solid lines in FIG. 4, the fiducial mark $F_Y$ for Y direction alignment is brought into coincidence with a slit $S_Y$ in the Y direction alignment optical system by movement of the stage 30 and then, as indicated by dots-and-dash line in FIG. 4, the stage 30 is moved in X direction to thereby bring the fiducial mark $F_Y$ for Y direction alignment into coincidence with a slit $S_T$ in the rotational alignment optical system. Where, at this time, the slit $S_T$ in the rotational alignment optical system is not adjusted to the movement of the stage 30, the alignment optical system is inclined by $\theta$ relative to the X direction of movement of the stage, as shown in FIG. 6A. If, in this state, the reticle is aligned relative to the alignment optical system, the exposure of the reticle to the wafer is effected with the reticle remaining inclined with respect to the feeding of the stage as indicated by broken line in FIG. 6A and therefore, each exposed chip is inclined. So, by rotating Harbing glass H (a parallel flat plate) provided in the imaging system of the rotational alignment optical system by a minute angle about an axis of rotation corresponding to the lengthwise direction of the slit $S_T$, as shown in FIG. 4, the slit $S_T$ is optically moved in the widthwise direction thereof (the direction perpendicular to the lengthwise direction) relative to the fiducial mark $F_Y$, whereby the two are adjusted so as to coincide with each other as shown in FIG. 6B. Thus, in this state, the rotational error of the alignment optical system has been completely eliminated relative to the direction of running or movement of the stage, and the initial setting of the alignment optical system relative to the apparatus body is completed. FIGS. 6A and 6B are plan views showing the positional relation on the reticle between the fiducial mark and the slits.

Figure 7:
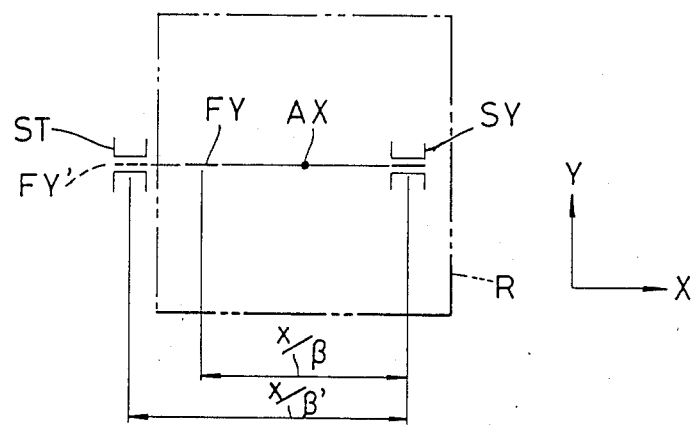
FIG. 7 is a plan view showing the positional relation of the fiducial mark on the surface of the reticle when there is a fluctuation of the magnification of the projection objective.
Figure 8:
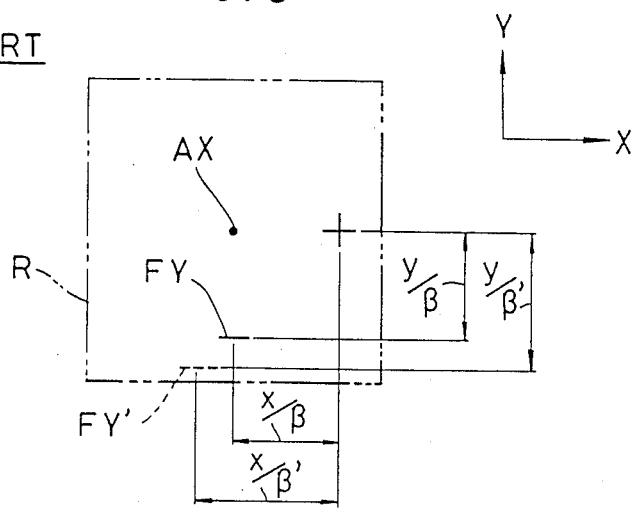
FIG. 8 is a plan view showing the positional relation of the fiducial mark on the surface of the reticle in the reticle alignment method according to the prior art when there is a fluctuation of the magnification of the projection objective.

In the alignment optical system as described above, where the initial setting relative to the running of the stage is to be effected, there is no possibility of causing a rotational error even if the magnification of the projection objective fluctuates from the standard magnification, as shown in FIG. 7 which shows the positional relation on the reticle like FIG. 6. In FIG. 7, where the stage is moved to effect the adjustment of the rotational alignment optical system relative to the slit $S_T$ after the slit $S_Y$ of the Y direction alignment optical system and the fiducial mark $F_Y$ for Y direction alignment have been brought into coincidence with each other, the fiducial mark $F_Y$ when the projection magnification of the projection objective from the reticle to the wafer is a reference value $\beta$ is indicated by solid line and the fiducial mark $F_Y'$ when the projection magnification fluctuates to $\beta'$ is indicated by dotted line. That is, relative to the amount of movement x of the stage, the amounts of movement of the fiducial marks on the surface of the reticle R are $x/\beta$ and $x/\beta'$, respectively. In FIG. 7, this difference is shown exaggerated. As described above, in the construction according to the present invention, the lengthwise direction of each slit corresponds to a line that intersects the optic axis of the projection objective on the surface of the reticle, and the direction in which the stage is moved for the position adjustment thereof relative to the slit $S_T$ of the rotational alignment optical system after the slit $S_Y$ and the fiducial mark $F_Y$ in the Y direction alignment optical system have been brought into coincidence with each other is always a direction across the optic axis of the projection objective and therefore, as shown, the corresponding position of the fiducial mark $F_Y$ on the surface of the reticle lies on the same straight line passing through the optic axis Ax even when the magnification of the projection objective is fluctuating. Therefore, displacement in Y direction does not occur relative to the movement of the stage in X direction as in the prior art shown in FIG. 8. Accordingly, even when there is a fluctuation of the magnification of the projection objective, it is possible to accurately align the alignment optical system without any rotational error relative to the running of the stage, namely, the apparatus body.

Movement of the stage is very precisely effected in X direction and Y direction orthogonal to each other by an interferometer and therefore, if correction of the rotational error is effected only relative to the running of the stage in X direction as described above, the initial setting of the alignment optical system relative to the apparatus body will be sufficient. Also, the relay lens 7 in each alignment system, as shown in FIG. 2, comprises a so-called Galilean system comprised of a positive lens and a negative lens, and where the projection objective is replaced by one having a different magnification, this Galilean system is reversely disposed so that the size of the fiducial mark image formed on the slit in each alignment system does not change. Further, while the above-described embodiment is a reduction projection type exposing apparatus, this is not restrictive. The present invention is equally effective in a projection type exposing apparatus wherein the position adjustment of the reticle alignment optical system is effected through a projection objective with the aid of a reference index mark provided on a stage supporting a wafer thereon.

Figure 9:
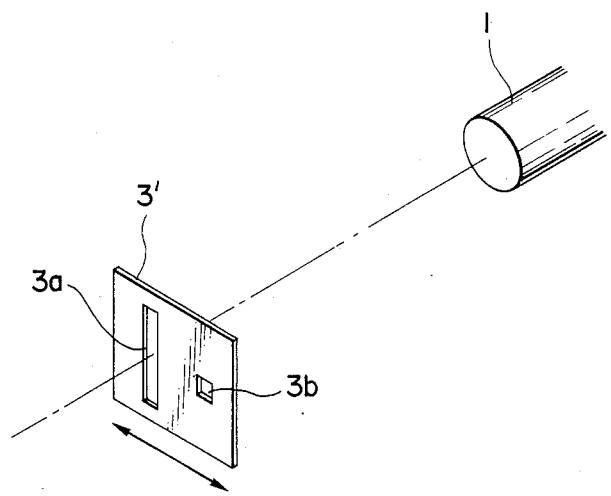
FIG. 9 is a schematic perspective view showing a part of a modification according to the present invention.
Figure 10:
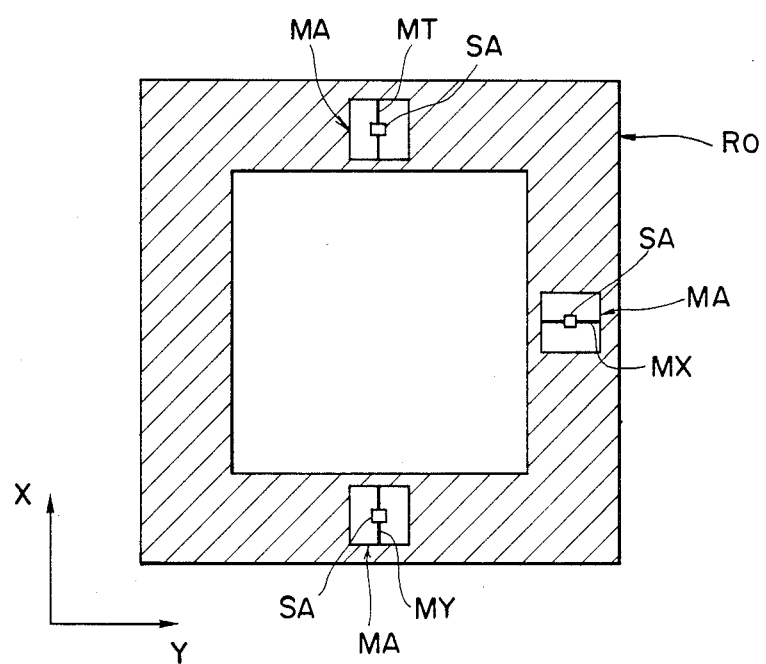
FIG. 10 is a plane view showing another reticle according to the present invention.

An improvement in the embodiment shown in FIG. 1 is shown in FIG. 9, in which, instead of the field stop 3 shown in FIG. 1, another field stop 3′ having a slit-like opening 3a and a square-like opening 3b is provided. The field stop 3′ is movable in a direction orthogonal to the optic axis of the condensing lens 1. When a reticle Ro shown in FIG. 10 is aligned with a wafer W (FIG. 12), the field stop 3′ is disposed in a position where the optic axis of the condensing lens passes through the center of the opening 3b. When the apparatus is aligned with the reticle Ro, the opening 3a is disposed in a position where the opening 3a assumes the status shown in FIG. 1. The mark $M_Y$ will be described hereinafter as a typical alignment mark in a plurality of mark areas MA of the reticle Ro.

Figure 11:
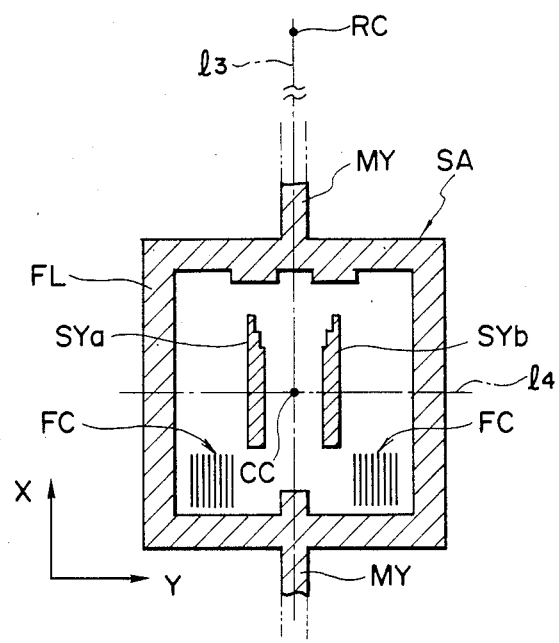
FIG. 11 is a plane view showing a part of the alignment mark of the reticle of FIG. 9.

The mark area MA is approx 5 mm×5 mm square area on the reticle Ro, and the mark $M_Y$ extending in X direction in a line-form is formed at the central position of y direction of the mark area. The mark area MA is formed as a light transparent portion of the reticle Ro, and its surrounding area indicated by slanting lines is a light intercepting layer on which chromium or the like is deposited by evaporation. Such light intercepting layer is not always necessary. The mark $M_Y$ is also formed as a light intercepting layer of chromium, etc. Such mark area MA is a first area. An extended line of the mark $M_Y$ is predetermined as passing through the center of the reticle Ro. The central part of this linear mark $M_Y$ (the central part in the mark area MA) is divided into two parts by a step alignment mark area SA as a second area. The mark area SA is a 250 μm square on the reticle Ro. As shown in FIG. 11, the mark area SA is partitioned by a square frame FL made of a light intercepting layer and two embracing step marks SYa, SYb are provided in parallel in the frame FL. When a line which passes through the central point CC of this mark area SA and is in parallel with X axis of the orthogonal coordinates system is called $l_3$ and another line in parallel with Y axis is $l_4$, the line $l_3$ is also the central line of the reticle alignment mark $M_Y$. The center of the reticle Ro is positioned on its extended line. The central point CC of the mark area SA is predetermined to be coincident with the central point of mark area MA. The alignment marks SYa, SYb are symmetrically disposed relative to the line $l_3$ and their end portions taper in tiers. As a result, when a mark or the like on the wafer is embraced by or located in between the marks SYa, SYb for observation with the eye, the embracing condition can be easily judged. Furthermore, in the mark area SA, a pattern FC in a line-and-space-like form is formed for focusing check by means of a projection lens.

In each of the three mark areas MA on the reticle Ro, a mark area SA as shown in FIG. 11 is formed in the same way. The size and form of the opening 3b are predetermined only to illuminate the step alignment mark area SA. The width of the frame FL shown in FIG. 11 is determined in accordance with the degree of obscurity on the reticle of the opening 3b, the setting accuracy of the field stop 3′, etc.

An optical system shown in FIG. 2 is used to detect alignment between a mark or the like on the wafer and the step marks SYa, SYb, etc., by observing image light in the step alignment mark area SA from image light passing through the semitransparent mirror 12 from the mark area MA. Two images of light from the step alignment mark areas SA provided in the marks $M_T$ and $M_Y$ on the reticle Ro are formed on the focusing screen 20 as shown in FIGS. 1, 2, 3A and 3B. Two images of the mark areas SA formed on the focusing screen 20 are re-imaged on an image pickup surface of an image pickup device such as a television camera or the like through the relay lens 21, the reflecting mirror 22 and the relay lens 23. The images of the mark areas SA are formed on the surface of the image pickup device 24 in such way that the line $l_4$ passing through the center CC of the image is in parallel with scanning lines. In accordance with an image signal from this image pickup device 24, a relative position between the step marks SYa, SYb and the mark, etc., on the wafer in the scanning direction is detected to achieve so-called TTL alignment.

Figure 12:
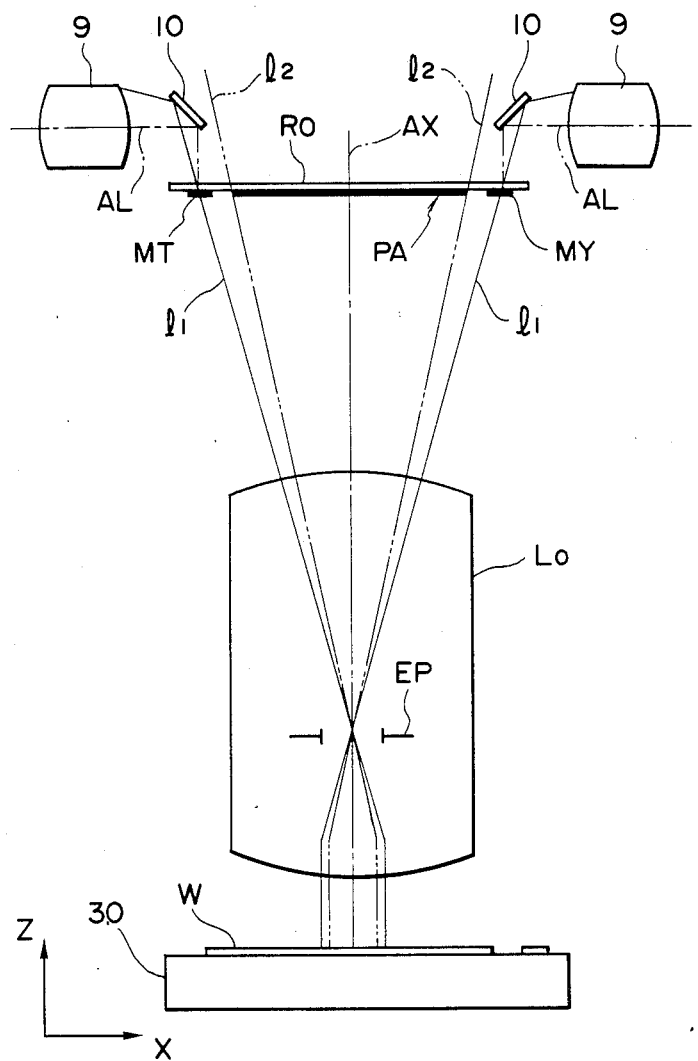
FIG. 12 is a plane view showing the relation of the optical axis and a principal ray of the alignment optical system.

FIG. 12 illustrates a schematic construction of the apparatus for full description of the disposition of the reflecting mirror 10 of the alignment optical system. The reflecting mirror 10 causes the optic axis AL of the objective 9 to be vertically bent in parallel with the optic axis AX of the projection lens Lo. When an objective (reticle $R_o$) side of the projection lens Lo is a non-telecentric system, the principal light rays $l_1$ of the objective 9 passing through the center of the pupil EP of the projection lens Lo through the marks $M_Y$, $M_T$ are inclined between the reticle $R_o$ R and the projection lens Lo relative to the optic axis AX. The principal light rays $l_2$ passing the outermost end of the pattern area PA in which a circuit pattern for the reticle is formed are also inclined relative to the optic axis AX, but the reflecting mirror 10 is fixed in such position as to prevent the pattern area PA from being light intercepted at the time of exposure. That is, the mark areas MA for the marks $M_X$, $M_Y$, $M_T$ are formed slightly apart from the pattern area PA. An image of the pattern area PA is projected and exposed on the wafer W. In this exposure, application of illuminating light from the optical fiber 1 is intercepted. The wafer W is mounted on the stage 30 of the step-and-repeat system. On this stage 30, a fiducial mark plate is provided to measure the disposing relation of the alignment optical system or to adjust an angle of the plane parallel plate H. A surface of the fiducial mark plate is a mirror face having a high reflective index in which two linear fiducial marks extend in x and y directions respectively to form a low reflecting portion. The surface of this portion is displaced to be coincident with the focusing plane of the projection lens Lo. It is of course possible to detect such fiducial marks by means of the alignment optical system shown in FIG. 1.

Next, operation of the alignment and the step alignment of the reticle Ro by the above-mentioned apparatus will be described.

Figure 13:
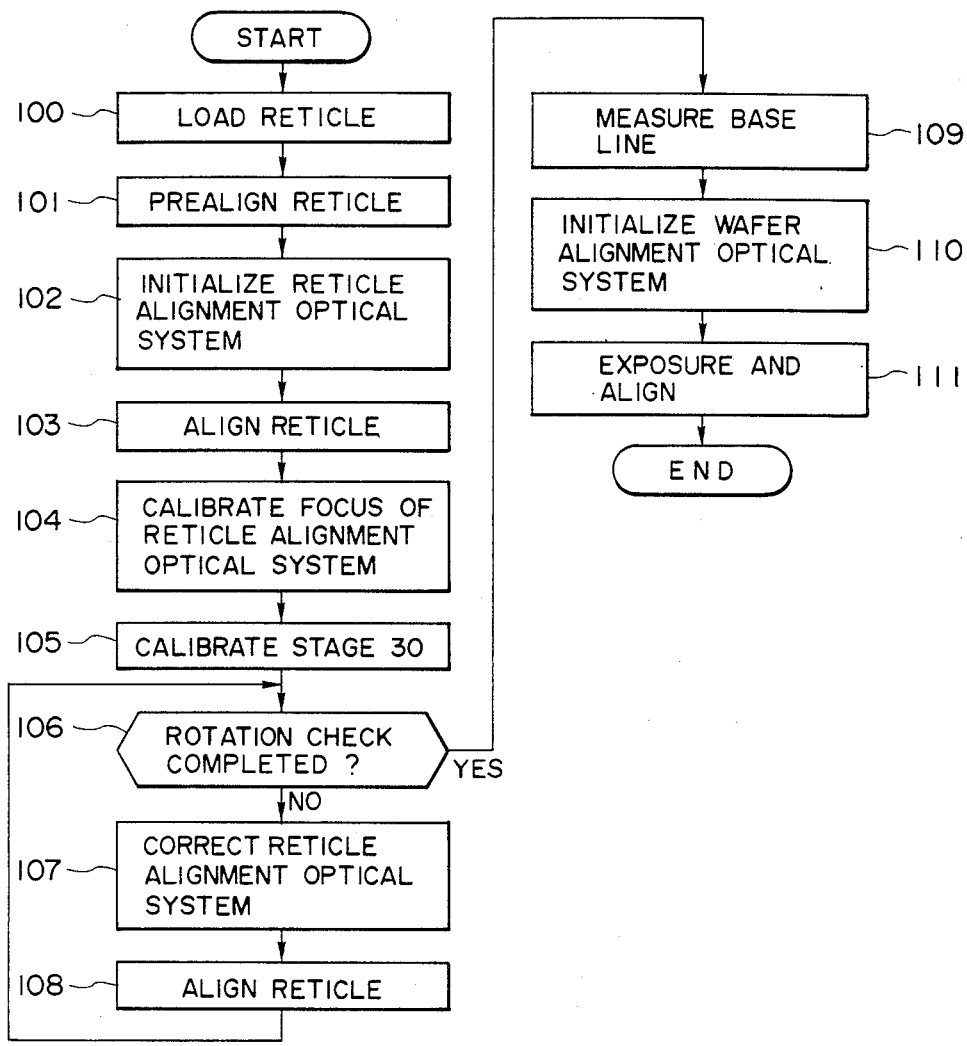
FIG. 13 is a flow chart showing the operation of the alignment of the exposing apparatus according to the present invention.

First the sequence of the reticle alignment will be explained in accordance with the flow chart shown in FIG. 13.

The reticle Ro as shown in FIG. 10 is loaded on the main body of the apparatus (Step 100) to perform mechanical prealignment of the reticle Ro (Step 101). The opening 3a of the slit plate 3′ is selected at the latest, at the termination of this prealignment. Due to this prealignment, the reticle Ro is set in such a way that an illuminating light image of the opening 3a on the reticle Ro should be positioned in a transparent portion of the reticle alignment mark area MA. The time of selecting the opening 3a of the slit plate 3' is not limited to the time of termination of the prealignment.

Next, the initial settings in the three alignment optical systems are performed as mentioned above (Step 102).

Then the position of the reticle Ro is determined by a fine adjustment mechanism relative to the reticle alignment optical system (Step 103).

Precise focusing operation is performed for the pattern face PA (the reverse side) of the reticle Ro in the alignment optical system (Step 104).

For this focusing operation, either the opening 3a or 3b may be employed. Such focusing operation is performed by observing a pattern FC formed in the mark area SA of the reticle Ro by the image pickup device 4 and the moving the focusing screen 20 and the relay lens 21 to achieve the maximum contrast. An example of the focusing operation using such pattern FC is disclosed in Japanese Laid Open Patent Application No. 101540/1985.

Next the focusing operation which makes the surface of the fiducial mark plate precisely coincident with imaging plane of the projection lens Lo is performed (Step 105). Then a position along th optic axis of the stage 30 is adjusted to obtain the maximum contrast. The fiducial position of the stage 30 in the direction of the optic axis AX is determined by this step 105 and another focus detector which functions during the exposing operation to the wafer (the slant incident light method or the air micrometer method) as disclosed in the Japanese Laid Open Application No. 101540/1985 detects a deviation of the stage 30 out of this fiducial positioned.

Next, a rotational error of the reticle Ro is detected more precisely (Step 106). There are several methods for such detection, two of which will now be explained.

In the first method, it is enough to detect how much detecting signals deviate from the zero point, which detecting signals are synchronously detected signals of photoelectric signals from the photoelectric detectors 16 of the alignment optical systems which detect the reticle alignment marks $M_Y$, $M_T$. At the time of the reticle alignment, the reticle Ro is slightly moved to position its detecting signal at the zero point and then a reticle stage on which the reticle Ro is mounted is fixed.

Figure 14:
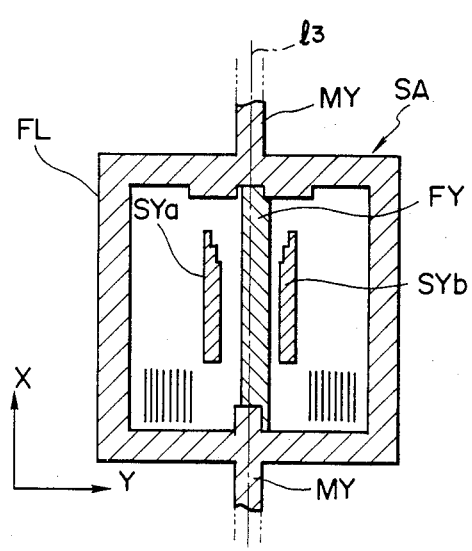
FIG. 14 is a plane view showing the positional relation of the part of the alignment mark of the reticle and the fiducial mark.

For the second method of the rotational check, the position of the stage 30 is first determined so that the fiducial mark $F_Y$ extending in x direction on the fiducial mark plate should be embraced by the step marks SYa, SYb as in FIG. 14. In accordance with image signals from the image pickup device 24, deviation $\Delta y1$ in y direction of the center (line $l_3$) between the step marks SYa, SYb, from the center in y direction of the fiducial mark $F_Y$ is detected. Then while y coordinate of the stage 30 is kept, the stage 30 is positioned in x direction so that the fiducial mark $F_Y$ is embraced by the step marks STa, STb which exist inside the reticle alignment mark $M_T$. In this status, in accordance with image signals from the image pickup device 24, deviation $\Delta y2$ in y direction of the center (line $l_3$) between the step marks SYa and SYb from the center in y direction of the fiducial mark $F_Y$ is detected in the same way. If there is a difference between $\Delta y1$, and $\Delta y2$, such difference corresponds to the rotational error.

If there is an error exceeding the allowable error as a result of the rotational check performed in the first or the second method mentioned above, the reticle alignment optical system is corrected (Step 107). In this step 107, the same operation is performed as that in the above-mentioned step 101. Instead of correcting the plane parallel plate H, offset voltage may be applied to detecting it signals following photoelectric signals from the photoelectric detector 16 for detecting the mark $M_T$.

For the reticle alignment optical system so corrected, the reticle R is aligned for the second time (Step 108).

As a result of the rotational check in the step 106, if an error is within the allowance, the rotational check is deemed to be completed and base line measurement of the apparatus is performed (Step 109). In such measurement, an interval in x or y direction between the irradiation position of the laser beam spot for detecting an alignment mark on the wafer W through the projection lens Lo and a detecting central position in each alignment optical system is measured by using the fiducial mark plate.

Figure 15:
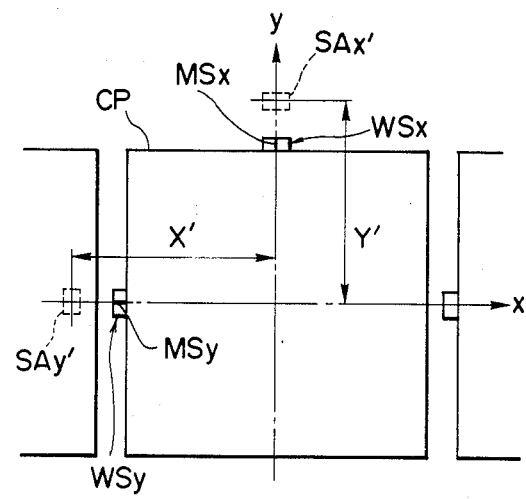
FIG. 15 is a plan view showing the positional relation of the wafer and the alignment marks of the reticle.

Next, an initial setting of each wafer alignment optical system (not shown) is made by using the fiducial mark plate (Step 110). In accordance with the measured value of the base line, the stage 30 is stepped to effect exposure of projected images of the pattern area PA of the reticle R in order on the wafer W (Step 111). If this exposure operation involves overlapping exposures on the wafer W, an alignment mark provided in an overlapping exposure area on the wafer W is aligned with a step mark on the reticle R (Step alignment) for every shot or for a specified shot. Such alignment is shown in FIG. 15. In FIG. 15, CP denotes an exposure area in which projected images of the pattern area PA have been overlapped and already exposed by a certain reticle to be developed.

Contiguous to said area, marks WSx, WSy are provided for the step alignment. The mark WSx is a linear mark extending on y axis in y direction while the mark WSy is a linear mark extending on x axis in x direction when the center of the exposure area CP is the origin of the xy coordinates system. As shown in FIG. 12, the reflecting mirror 10 in the alignment optical system is disposed so as not to intercept light to the pattern area PA. Accordingly each projected image SAx' or SAy' of SA in the step alignment mark area is deviated from the position for exposure as shown in FIG. 15.

For the exposure position at which the center of the exposure area CP (the origin of the xy coordinate system) meets the optic axis AX, distances from the center of the exposure area CP to the projected images SAx', SAy' are fixed as Y', X' respectively. In the step alignment, the wafer W is displaced by a predetermined distance in y direction to overlap the projected image SAx' and the mark WSx and then illuminating light is applied from the optical fiber 1 to detect an embracing condition of the step alignment marks SXa, SXb and the mark WSx so that positional deviation in X direction is obtained in accordance with image signals from the image pickup device 24. After that, light application from the optical fiber 1 for forming the projected image SAx' is terminated and then the wafer is moved by the predetermined distance so that the projected image SAy' is overlapped on the mark WSy, thereby obtaining a positional deviation in y direction of the step marks SYa, SYb from the mark WSy.

For this step alignment, the opening 3b of the field stop 3' is selected.

After deviations in x direction and y direction are obtained, the stage 30 is positioned so as to correct such deviations and then exposure is effected.

In the step 106 of the above sequence, if reticle rotational error remains though being within the allowance, coordinate values of the projected point of the center of the reticle Ro by the projection lens Lo can be calculated in accordance with the quantity of said remaining rotation, coordinate value of the center between the step alignment marks SYa and SYb in y direction and coordinate value of the center between the step alignment marks SXa and SXb in x direction.

Therefore, the position of the projected point of said center may be deemed as the origin of the base line measurement values (coordinate values on the reticle side).

Figure 16:
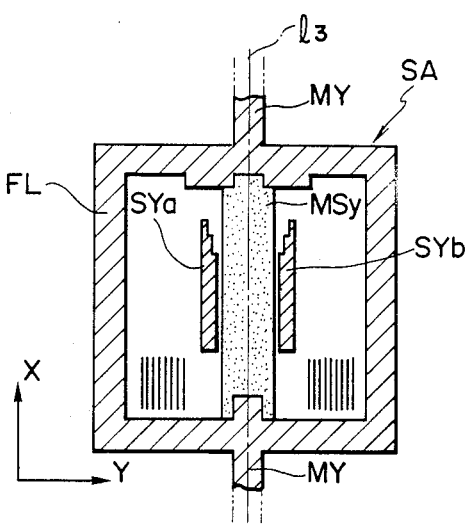
FIG. 16 is a plane view showing the positional relation of the part of the alignment mark of the reticle and a part of the alignment mark of the wafer.

The linear mark MSy shown in FIG. 16 is formed inside the mark WSy. The width of said mark MSy is so determined as to be tightly embraced by the step marks SYa, SYb when observed by the image pickup device 24. For alignment effected by eye, it is enough to observe the embracing condition in this part by paying special attention to a tiered portions of the step marks SYa, SYb.

Figures 17A, 17B, 17C:
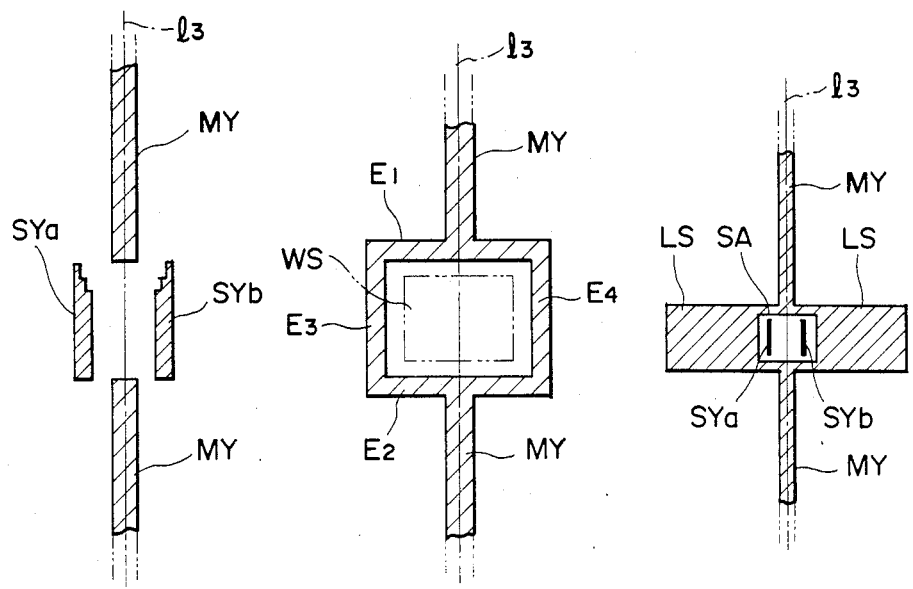
FIGS. 17A, 17B, 17C and 17D are plan views each of which show another embodiment of the alignment mark of the reticle according to the present invention.

In FIG. 17A, only the step alignment marks SYa, SYb are provided in the central portion of the reticle alignment mark $M_Y$. If the degree of precision in manufacturing or at the time of selecting the opening 3a of the field stop 3' is sufficient, the frame FL is not necessary.

In FIG. 17B, a step alignment mark is made as a rectangular frame so that its edges $E_1$, $E_2$, $E_3$, $E_4$ of the four inner sides are used for alignment. On the wafer a rectangular mark $W_S$ is formed as being housed in the rectangular frame and then aligned as shown in FIG. 17B.

In this case, the same alignment operation as in each of the above-described embodiments can be performed by detecting an interval between the edges of the mark $W_S$ in parallel with the edges $E_3$, $E_4$ and positional deviation of the reticle Ro from the wafer W in a direction along the central line $l_3$ can be obtained by detecting an interval of the edges of the mark $W_S$ in parallel with the edges $E_1$ $E_2$. If the positional deviation in the direction of the central line $l_3$ has been obtained for the step alignment mark on the opposite side with respect to the optic axis AX of the projection lens Lo in the same way, a projection magnification error including expansion or contraction of the wafer can be obtained by those deviations. In FIG. 17C, the portions forming the two sides of the frame FL of the step alignment mark which are in parallel with the central line $l_3$ are extended right and left in the direction orthogonal to the central line $l_3$ to become a light intercepting section LS.

When providing the light intercepting section LS in such a way, the light intercepting section LS itself can be a sign indicating the presence of the reticle alignment mark $M_Y$.

Figure 17D:
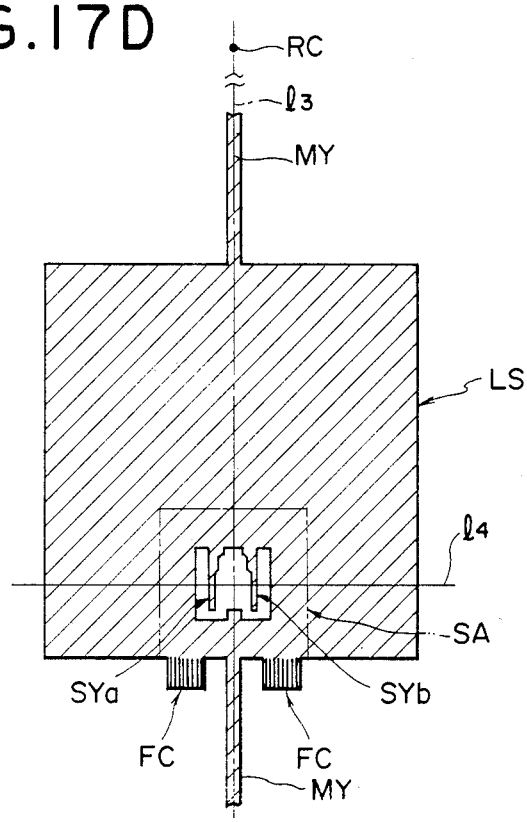

FIG. 17D is a plan view showing form of the mark in which the light intercepting portion is formed in a rather wide range surrounding the step alignment mark area SA to prevent a part of the illuminating light reflected at the wafer and inversely incident to the projection lens Lo from being multiply reflected inside the reticle R and becoming stray beams. When the projection lens Lo is non-telecentric system at the reticle side, the principal light ray of the light beam for illuminating each mark area on the reticle is not perpendicular to a pattern face of the reticle R. Therefore, the principal light ray of another light beam which is reflected at the wafer and returns to the pattern face of the reticle R is inclined relative to the pattern face in the same way. For this reason, when returned light passes through a transparent portion of the reticle R, in particular through a window portion in which the step alignment marks SYa, SYb are formed, said light is multiply reflected on the observe and the reverse faces of the reticle R to be incident to the step alignment optical system. Such light created by the multiple reflections deteriorates the quality of an image observed by the image pickup device 24, especially of the step marks WSy, WSx on the wafer. Such multiple reflection is generated when the projection lens Lo is a telecentric system either on a reticle or a wafer side.

Therefore the window portion in which the step alignment marks SYa, SYb are formed is made smaller to the extent that mark detection is not impeded (e.g. 150 μm square) and a surrounding area in a rather wide range should be covered with a light intercepting section LS. This light intercepting section especially stretches out to the center RC of the reticle R and is determined to be a rectangle having 700 to 800 μm sides on the reticle R. The light intercepting section LS is preferably made of low-reflective chromium or the like.

The center (line $l_3$) of the reticle alignment mark is made coincident with the center of the step alignment mark because it is a necessary condition for the optic axis AL of the objective 9 to pass through both the center of the reticle alignment mark and that of the step alignment mark since the reflecting mirror 10 and the objective 9 in the alignment optical system shown in FIG. 1 are fixed. Since it is possible to observe the entire reticle alignment mark area MA by the objective 9, the step alignment mark area SA could be disposed in any part in the mark area MA. However, it naturally would be much affected by distortion or the like of the objective 9. On the other hand, coincidence of both centers of the step alignment mark and the reticle alignment mark results in such advantage that reticle information such as a mark position used for the alignment is unified and the apparatus needs less information to store. Furthermore, since the reticle alignment marks and the step alignment marks can be observed or detected through a single objective optical system, conventional disposing error between a plurality of optical systems, drift, etc, have no effect any more so that more precise base line measurement, etc., can be obtained.

According to the embodiments, the step alignment is performed in an alignment optical system fixed in the apparatus, so no dust nor refuse is generated from a movable portion unlike an apparatus in the prior art in which a part of the alignment optical system is movable.

According to the present invention, as described above, a projection type exposing apparatus of excellent performance is achieved in which even when the projection magnification of the projection objective is varied by some cause or other, it is possible to accurately effect the position adjustment of the reticle alignment optical system which provides the reference of the reticle alignment and which enables the manufacture of super LSI higher in degree of integration.

We claim;

1. An exposing apparatus for exposing a plurality of exposure areas on a substrate by light of a predetermined wavelength, wherein said substrate has a plurality of first areas, each of which has a first mark disposed between adjacent ones of said plurality of exposure areas, including:
- as mask formed by a light transparent portion and a light intercepting portion, said mask having a main area, a second area in which a second mark is disposed and a third area in which a third mark is disposed, said second area being disposed outside said main area and said third area being disposed inside said second area;
- stage means for mounting said substrate;
- projecting means provided with a projection optical system for projecting the image of said main area of said mask formed by said projection optical system on one of said plurality of exposure areas of said substrate mounted by said stage means;
- illuminating means including a light source, light from which is of a wavelength substantially equal to said predetermined wavelength, said illuminating means having a first status in which said illuminating means illuminates said second and third areas simultaneously by light from said light source, and having a second status in which said illuminating means illuminates said third area by light from said light source, one of said first areas adjacent said one of said plurality of exposure areas being illuminated by light passed through a light transparent portion of said third area and said projection optical system when said illuminating means is in said second status;
- an objective optical system;
- first detecting means provided with a first detecting plane responsive to said illuminating means for detecting the position of an image of said second mark formed by said objective optical system on said first detection plane in said first status;
- second detecting means provided with a second detecting plane responsive to said illuminating means for detecting a displacement between images of said first and third marks formed by said objective optical system on said second detection plane in said second status and producing a detection signal; and
- displacement means responsive to said detection signal for providing a relative displacement between said mask and said substrate so that the images of said first and third marks formed by said objective optical system assume a predetermined relationship.

2. An apparatus according to claim 1, wherein said second mark has a shape extended in a direction toward a center of said main area.

3. An apparatus according to claim 2, which further comprises another displacement means responsive to an output of said first detecting means for providing a relative displacement between said first detecting means and said mask.

4. An apparatus according to claim 1, wherein said illuminating means does not illuminate said second area in said second status.

5. An apparatus according to claim 1, wherein said illuminating means has an aperture means provided with a first opening and a second opening which is smaller than said first opening, and wherein said illuminating means illuminates said second and third marks by light through said first opening from said light source in said first status and illuminates said third mark by light through said second opening from said light source in said second status.

6. An apparatus according to claim 5, wherein said aperture means is a plate provided with said first opening and said second opening, and wherein said plate is movable in a direction which is substantially perpendicular to an optical axis of said objective optical system.

7. An apparatus according to claim 6, wherein said plate is moved so that the optical axis of said objective optical system passes through said first opening in said first status and passes through said second opening in said second status.

8. An apparatus according to claim 7, wherein said first opening is a slit-like opening, 9. An exposing apparatus for holding a mask provided with a main area for exposing a plurality of exposure areas on a substrate by light passed through said main area, a first mark being disposed on said substrate between adjacent ones of said plurality of exposure areas, said mask having a second area in which a second mark is formed and a third area in which a third mark is formed, said apparatus comprising:
- illuminating means including a light source, said illuminating means having a first status in which said illuminating means illuminates said second and third marks simultaneously by light from said light source and having a second status in which said illuminating means illuminates said third mark by light from said light source, said first mark being illuminated by light through said third area from said light source;
- an objective optical system;
- first detecting means responsive to said illuminating means for detecting an image of said second mark formed by said objective optical system in said first status; and
- second detecting means responsive to said illuminating means for detecting images of said first and third marks formed by said objective optical system in said second status.

10. An apparatus according to claim 9, which further comprises displacement means responsive to an output of said first detecting means for providing a relative displacement between said mask and said substrate so that the images of said first and third marks formed by said objective optical system assume a predetermined relationship.

11. An apparatus according to claim 10, which further comprises another displacement means responsive to an output of said first detecting means for providing a relative displacement between said first detecting means and said mask.

12. An apparatus according to claim 11, wherein said mask is formed by a light transparent portion and a light intercepting portion, and wherein said second area is disposed outside said main area and said third area is disposed inside said second area.

13. An apparatus according to claim 12, wherein said illuminating means does not illuminate said second area in said second status.

14. An apparatus according to claim 13, wherein said illuminating means has an aperture means provided with a first opening and a second opening which is smaller than said first opening, and wherein said illuminating means illuminates said second and third marks by light through said first opening from said light source in said first status and illuminates said third mark by light through said second opening from said light source in said second status.

15. An apparatus according to claim 14, wherein said aperture means is a plate provided with said first opening and said second opening, and wherein said plate is movable in a direction which is substantially perpendicular to an optical axis of said objective optical system.

16. An apparatus according to claim 15, wherein said plate is moved so that the optical axis of said objective optical system passes through said first opening in said first status and passes through said second opening in said second status.

17. An apparatus according to claim 16, wherein said first opening is a slit-like opening.

* * * * *